United States Patent [19]
Park et al.

[11] Patent Number: 5,923,069
[45] Date of Patent: Jul. 13, 1999

[54] VOLTAGE LEVEL DETECTING CIRCUIT

[75] Inventors: Jong-Hoon Park; Jae-Woon Kim, both of Choongcheongbuk-Do, Rep. of Korea

[73] Assignee: LG Semicon Co., Ltd., Cheongju, Rep. of Korea

[21] Appl. No.: 08/891,098

[22] Filed: Jul. 10, 1997

[30]     Foreign Application Priority Data

Jul. 12, 1996 [KR]  Rep. of Korea ....................... 96-28128

[51] Int. Cl.$^6$ .................................................. H01L 29/76
[52] U.S. Cl. ............................ 257/365; 327/78; 327/437; 327/537
[58] Field of Search ..................................... 257/355, 357, 257/365; 327/535, 537, 78, 437; 326/83

[56]         References Cited

U.S. PATENT DOCUMENTS 5,708,625  1/1998  Sato et al. ............................. 365/233.5
5,773,999  6/1998  Park et al. ............................... 327/108

*Primary Examiner*—Minh Loan Tran
*Attorney, Agent, or Firm*—Fleshner & Kim

[57]           ABSTRACT

An improved voltage level detecting circuit that provides stable voltage detection. The voltage level detecting circuit senses a level of a voltage to be detected only when two clock signals are at a low level after ORing the signals. After detecting the voltage level, the circuit reduces power consumption by preventing a current path between the voltage and ground. Consistent operation of the voltage level detecting circuit is achieved despite fluctuation of the voltage level to be detected caused by noise through detecting the level of the voltage only when a specific clock signal is enabled.

20 Claims, 3 Drawing Sheets

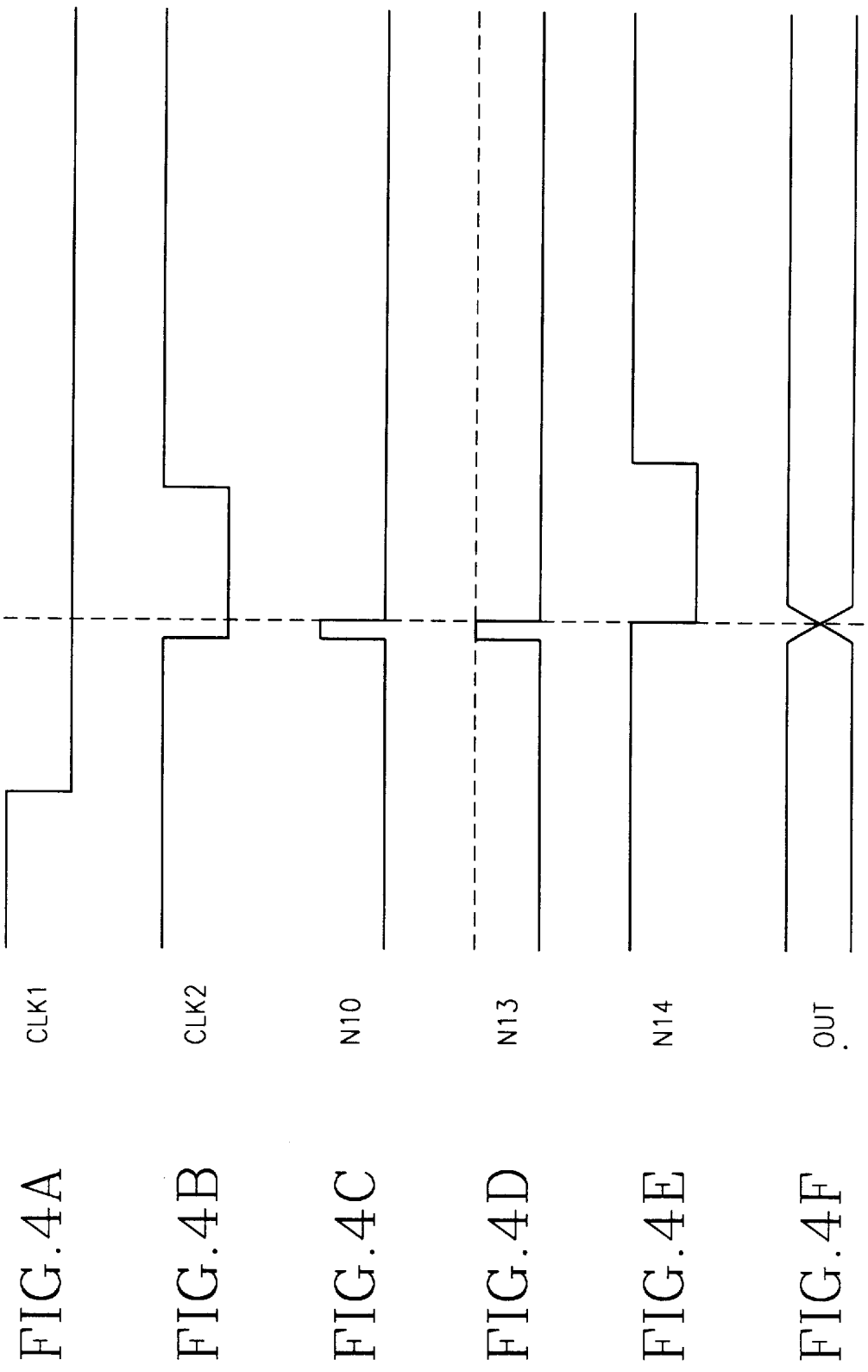

VOLTAGE LEVEL DETECTING CIRCUIT

BACKGROUND OF THE INVENTION

1. Field of the Invention

The present invention relates to voltage level detection, and in particular, to a voltage level detecting circuit that reduces power consumption in a stand-by state and stably operates despite circuit noise.

2. Background of the Related Art

A related art voltage level detecting circuit for detecting a voltage (Vcc) is shown in FIG. 1. In the related art voltage level detecting circuit, a plurality of NMOS transistors (NM1–NM4) having their drains connected to their gates are series connected and the voltage (Vcc) is applied to the gate of the first NMOS transistor (NM1). The series connected NMOS transistors (NM1–NM4) are also connected by the drain of NMOS transistor NM4 to a drain of an additional NMOS transistor (NM5) through a connecting point (N1). The source of the additional NMOS transistor (NM5) is grounded (Vss). The voltage from the connecting point (N1) passes through series inverters (IN1, IN2) and is output as a voltage level detecting signal (OUT).

The operation of the related art voltage level detecting circuit shown in FIG. 1 will now be described.

When power is input to an apparatus, the level of the voltage (Vcc), which is the voltage to be detected, is increased. As the voltage (Vcc) sequentially passes through the series connected NMOS transistors (NM1–NM4), the voltage level drops by each transistor threshold voltage (Vt), respectively, and the resulting voltage appears at the node (N1).

The voltage (Vcc) is also applied to the gate of the additional NMOS transistor (NM5).

When the voltage level of the node (N1) is lower than a threshold voltage of the inverter (IN1), the voltage input to the inverter (IN1) is determined to be low. The low input voltage passes sequentially through the invertors (IN1, IN2) to output a low level voltage level detecting signal (OUT).

Then, as the level of the voltage (Vcc) is gradually increased (and dropped through the series connected NMOS transistors (NM1–NM4)), the voltage level at the node (N1) also increases. When the voltage level at the node (N1) becomes higher than the threshold voltage of the inverter (IN1), the inverter (IN1) determines that the input voltage is high. In this case, the high voltage from the node (N1) passes sequentially through the inverters (IN1, IN2) to output a high level voltage level detecting signal (OUT).

In the related art operation for detecting the voltage level, as the level of the voltage to be detected increases the level of the voltage level detecting signal is maintained low for a predetermined time. When the level of the voltage (Vcc) exceeds a preset level, the voltage level detecting signal is momentarily changed into a high level signal as shown in FIG. 2.

However, since the related art voltage level detecting circuit has a current path between the voltage (Vcc) and ground, much power continues to be consumed. Further, the level of the voltage level detecting signal changes to the low level when the level of the detected voltage drops below the preset voltage. Accordingly, near the preset voltage, the value of the voltage level detecting signal can fluctuate between high and low because of noise. Thus, stable operation of the related art voltage level detecting circuit cannot be achieved.

The above references are incorporated by reference herein where appropriate for appropriate teachings of additional or alternative details, features and/or technical background.

SUMMARY OF THE INVENTION

An object of the present invention is to substantially obviate one or more of the problems caused by limitations and disadvantages of the related art.

Another object of the present invention to provide a voltage level detecting circuit that reduces power consumption in stand-by operations.

Another object of the present invention is to provide a voltage level detecting circuit that provides stable voltage detection despite circuit noise.

Another object of the present invention is to provide a voltage level detecting circuit that determines a detecting level by sensing a level of a voltage only when two clock signals are both low level after ORing the signals and detecting whether the level of the voltage reaches a predetermined level.

Such objects, features and advantages may be achieved at least in part or whole by using a voltage level detecting circuit which includes a voltage level detection controller for outputting an enable signal after logically operating first and second clock signals and delaying the second clock signal for a predetermined time, a voltage level detector for detecting a level of a voltage to be detected in accordance with the enable signal from the voltage level detection controller, and a signal output unit for receiving an output signal from the voltage level detector after the voltage level detector is initialized in accordance with the delayed clock signal from the voltage level detection controller.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein:

FIGS. 4A–4F are diagrams showing timing of the circuit of FIG. 3.

DETAILED DESCRIPTION OF PREFERRED EMBODIMENTS

Figure 1:
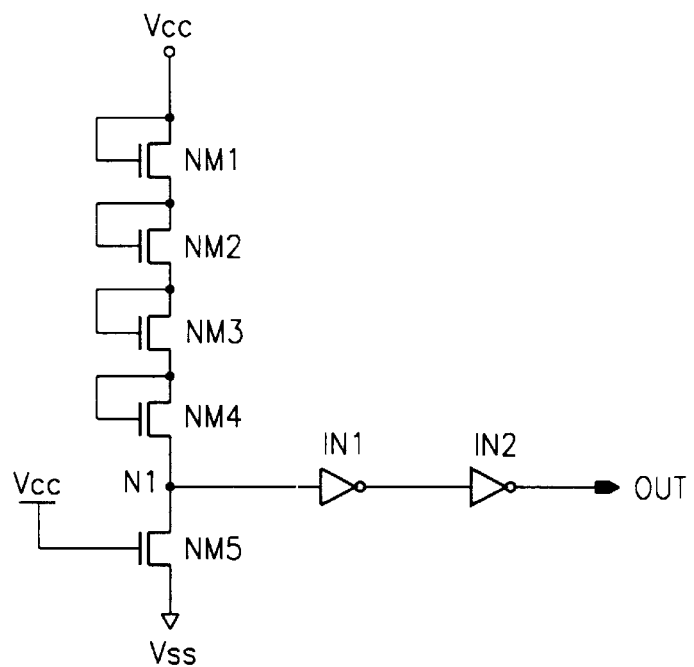
FIG. 1 is a schematic circuit diagram showing a voltage level detecting circuit according to the related art.
Figure 2:
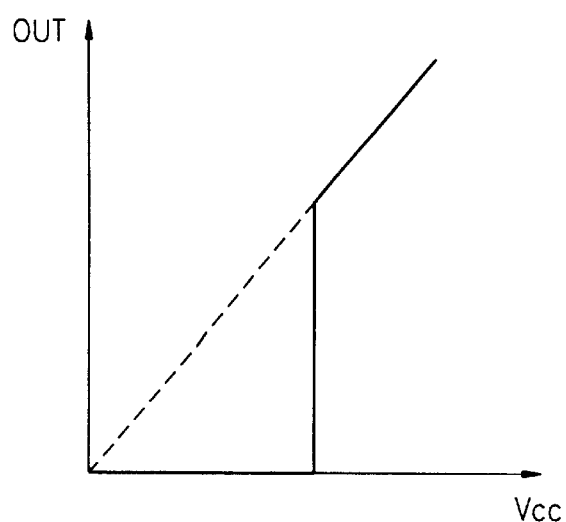
FIG. 2 is waveform diagram showing voltage level detection for the circuit of FIG. 1.
Figure 3:
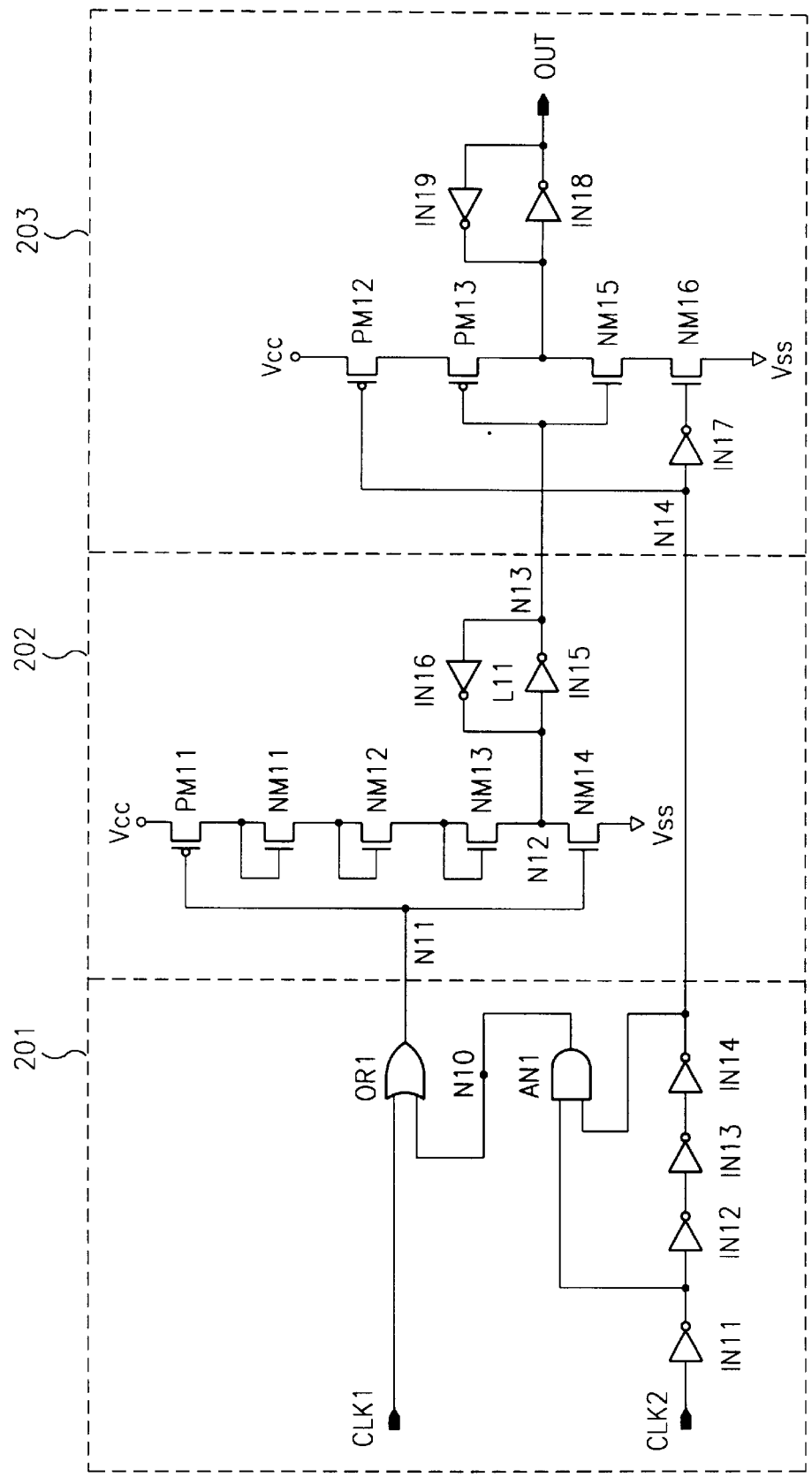
FIG. 3 is a schematic circuit diagram showing a voltage level detecting circuit according to one embodiment of the present invention.

With reference to FIGS. 3–4F, a first preferred embodiment of a voltage level detecting circuit according to the present invention is described below.

As shown in FIG. 3, a voltage level detecting circuit includes a voltage level detection controller 201, a voltage level detector 202 and a signal output unit 203. The voltage level detection controller 201 outputs an enable signal for detecting a voltage level after logically processing clock signals (CLK1, CLK2). The logical processing preferably includes delaying the clock signal (CLK2) for a predetermined time. The voltage level detector 202 detects a level of a voltage to be detected (i.e., Vcc), preferably when the enable signal received from the voltage level detection controller is low level. The signal output unit 203 inputs a first signal, which preferably is a signal from the voltage level detector 202. After being initialized by a second input signal, which is preferably the delayed clock signal (CLK2) from the voltage level detection controller 201, the signal output unit 203 uses the signal from the voltage level detector 202 to generate the voltage level detecting signal (OUT).

The voltage level detection controller 201 includes series inverters (IN11–IN14), an AND gate (AN1) and an OR gate (OR1). The series inverters (IN11–IN14) sequentially delay the clock signal (CLK2) for a predetermined time. The delayed clock signal based on the clock signal (CLK2) is output from the inverter (IN14) at a node (N14) to the signal output unit 203. The AND gate (AN1) ANDs output signals from two inverters (IN11, IN14) of the series inverters (IN11–IN14) to generate a short pulse for initializing the voltage level detector 202. The OR gate (OR1) ORs the output signal from the AND gate (AN1) and the clock signal (CLK1) to generate and output the enable signal to the voltage level detector 202.

The voltage level detector 202 couples a node (N11) coupling an output terminal of the voltage level detection controller 201 with gates of a PMOS transistor (PM11) and an NMOS transistor (NM14). A source of the PMOS transistor (PM11) receives the voltage (Vcc). A source of the NMOS transistor (NM14) is grounded. NMOS transistors (NM11–NM13) are sequentially coupled in series between a drain of the PMOS transistor (PM11) and a drain of the NMOS transistor (NM14). Further, gates and drain terminals of each of the NMOS transistors (NM11–NM13) are commonly coupled. A node (N12) couples a coupling point of two of the NMOS transistors (NM13, NM14) to the signal output unit 203 through a first latch (LT11).

The first latch (LT11) includes inverters (IN15, IN16) coupled oppositely in parallel (i.e., reverse parallel).

The signal output unit 203 applies the delayed clock signal from the voltage level detection controller 201 at the node (N14) to the gate of a PMOS transistor (PM12) and to an inverter (IN17) for inverting the delayed clock signal. An output signal of the inverter (IN17) is applied to a gate of an NMOS transistor (NM16), which has a grounded source. A source of the PMOS transistor (PM12) receives the voltage (Vcc). In the signal output unit 203, the output signal from the voltage level detector 202 is applied to gates of a PMOS transistor (PM13) and an NMOS transistor (NM15). A source of the PMOS transistor (PM13) is coupled to the drain of the PMOS transistor (PM12). A source of an NMOS transistor (NM15) is coupled to the drain of the NMOS transistor (NM16). A node (N15) couples drains of the PMOS transistor (PM13) and the NMOS transistor (NM15) through a second latch (LT12) to an output terminal that outputs the voltage level detection signal (OUT). The second latch (LT12) includes inverters (IN18, IN19) coupled in reverse parallel.

The delayed clock signal output from the voltage level detection controller 201 can be used to determine the detecting voltage of the voltage level detector 202 after the voltage level detector 202 is initialized.

Operations of the first preferred embodiment of the voltage level detecting circuit is described below.

After power to the apparatus is turned on, an output signal from the OR gate (OR1) is maintained high level while the clock signal (CLK1) is high level. Further, the PMOS transistor (PM11) is kept turned off and the NMOS transistor (NM14) is kept turned on while the output signal from the OR gate (OR1) is maintained high level.

In the voltage level detection controller 201 when the clock signal (CLK2) is high level, the clock signal (CLK2) passes sequentially through the inverters (IN11–IN14) and then is maintained high level. The delayed clock signal is output to the signal output unit 203 at the node (N14). Therefore, in the signal output unit 203, the PMOS transistor (PM12) and the NMOS transistor (NM16) are kept turned off. Accordingly, the second latch (LT12) latches the previous value of the voltage level detecting signal (OUT).

Next, when the clock signal (CLK1) shown in FIG. 4A becomes low level, an output signal from the OR gate (OR1) in the voltage level detection controller 201 becomes low level. In the voltage level detector 202 as a result, the PMOS transistor (PM11) is turned on and the NMOS transistor (NM14) is turned off. But, when the clock signal (CLK2) is high level, the PMOS transistor (PM12) and the NMOS transistor (NM16) in the signal output unit 203 are maintained off based on the high level of the delayed clock signal at the node (N14). Consequently, the second latch (LT12) latches the previous output value of the voltage level detecting signal (OUT).

Then, when the clock signal (CLK2) shown in FIG. 4B becomes low level, the shifted clock signal (CLK2) is delayed for a predetermined time through the inverters (IN11–IN14) and the AND gate (AN1) generates a short high level pulse for initializing the voltage level detector 202. Thus, the OR gate (OR1) outputs a short high level pulse, as shown in FIG. 4C.

While the short high level pulse is output from the OR gate (OR1), the PMOS transistor (PM11) is turned off and the NMOS transistor (NM14) is turned on. As a result, a voltage value of the node (N12) becomes low level, and is latched in the first latch (LT11). Latching the low value in the first latch (LT11) outputs a high level output signal from the voltage level detector 202 at the node (N13).

In other words, when the node (N11) becomes temporarily high level from the clock signal (CLK2) transition to low level, the voltage level detector 202 becomes initialized and initializes the output signal high level, as shown in FIG. 4D.

While the output terminal of the voltage level detector 202 at the node N13 is high level, the delayed clock signal at the node N14 is temporarily high level to keep the PMOS transistor (PM12) and the NMOS transistor (NM16) off. Consequently, the output terminal of the signal output unit 203 maintains the previous value of the voltage level detecting signal (OUT).

Then, in the voltage level detector 201, the low level of the clock signal (CLK2) delayed by sequentially passing through the inverters (IN11–IN14) reaches the AND gate (AN1). Thus, the output signal from the AND gate (AN1) becomes low level, and consequently the output signal from the OR gate (OR1) becomes low level. As a result, in the voltage level detector 202, the PMOS transistor (PM11) is turned on and the NMOS transistor (NM14) is turned off which starts the voltage level detecting operation.

That is, after the voltage level detector 202 is initialized as shown in FIG. 4D, the voltage (Vcc) applied to the PMOS transistor (PM11) drops by the threshold voltages (Vt) of the NMOS transistors (NM11–NM13) and the resultant voltage value appears at the node (N12).

When the resultant value of the voltage at the node (N12) is lower than the threshold voltage of the inverter (IN15), the voltage value at the node (N13) becomes high level. When the resultant voltage value is higher than the inverter (IN15) threshold voltage, the node (N13) voltage becomes low level. The node (N13) serves as the output terminal of the first latch (LT11).

Further, when the delayed clock signal at node (N14) becomes low level, the PMOS transistor (PM12) is turned on and the NMOS transistor (NM16) is turned on to detect the applied voltage (i.e., Vcc) after the voltage level detector 202 is initialized. Then, in the signal output unit 203, the output signal from the voltage level detector 202 is inverted in an inverter including the PMOS transistor (PM13) and the NMOS transistor (NM15) and latched in the second latch (LT12). Thereby, as shown in FIG. 4F, the voltage level detecting signal (OUT) is output as a high or low level based on the level of the node (N13).

Next, when the clock signal (CLK2) becomes high level again as shown in FIG. 4B, the delayed clock signal becomes high level as shown in FIG. 4E after sequentially passing through the inverters (IN11–IN14). As a result, the PMOS transistor (PM12) and the NMOS transistor (NM16) in the signal output unit 203 are turned off, and the previous output level of the second latch (LT12) is maintained.

Thus, the voltage level detecting operation is carried out when the clock signal (CLK2) is low level. Further, the signal output unit 203 latches the level of the voltage (Vcc) to be detected when the clock signal (CLK2) becomes high level after the voltage detection operation. Thus, although the level of the voltage (Vcc) to be detected can change because of noise, the voltage level detecting signal (OUT) is maintained. In the first preferred embodiment, the voltage level detecting signal is maintained as a constant value in the second latch(LT12). Thus, stable operation of the voltage level detecting circuit is performed.

As described in detail above, the voltage level detecting circuit according to the first preferred embodiment beneficially reduces the power consumption by cutting off a current path between the applied voltage (Vcc) and ground after detecting the voltage level. In addition, the voltage level is detected only when a specific clock signal is enabled.

It is to be understood that both the foregoing general description and the following detailed description are exemplary and explanatory. It will be apparent to those skilled in the art that various modifications can be made in the voltage level detecting circuit and method of the present invention without departing from the spirit or scope of the invention. It is intended that the present invention cover the modifications and variations of this invention that are within the scope of the appended claims and their equivalents.

What is claimed is:

1. A voltage level detecting circuit, comprising:
   voltage level detection control means for outputting a control signal of a prescribed pulse width after logically operating first and second signals and for delaying the second signal for a predetermined time, wherein the first and second signals are two separate signals;
   voltage level detecting means for detecting a voltage level based on the control signal from the voltage level detection control means; and
   signal output means for receiving an output signal from the voltage level detecting means after the voltage level detecting means is initialized based on the delayed second signal in the voltage level detection control means.

2. The circuit of claim 1, wherein the first and second signals are clock signals.

3. The circuit of claim 1, wherein the voltage level detection control means comprises:
   a delay circuit that delays the second clock signal for the predetermined time to output the delayed second signal;
   a first logic gate for logically operating an inverted second signal and the delayed second signal, wherein the first logic gate generates a pulse that initializes the voltage level detecting means; and
   a second logic gate for logically operating an output signal from the first logic gate and the first clock signal to output the control signal.

4. The circuit of claim 3, wherein the delay circuit is a plurality of series coupled inverters, the first logic gate is an AND gate and the second logic gate is an OR gate.

5. The circuit of claim 4, wherein the inverted second signal is output by a first inverter of the plurality of series coupled inverters.

6. The circuit of claim 1, wherein in the voltage level detecting means comprises:
   a first transistor of a first conductivity type;
   second, third, fourth and fifth transistors of a second conductivity type; and
   a first latch, wherein the control signal from the voltage level detection control means is commonly applied to control electrodes of the first transistor and the second transistor, wherein the third, fourth and fifth transistors are coupled in series between a second electrode of the first transistor and a second electrode of the second transistor, wherein the third, fourth and fifth transistors have commonly coupled control electrodes and second electrodes, a coupling point between the second electrode of the second transistor and a first electrode of the fifth transistor couples to the signal output means through the first latch, a voltage to be detected is applied to a first electrode of the first transistor, and a first electrode of the second transistor is coupled to a first potential.

7. The circuit of claim 6, wherein the control signal disables the first and second transistors after the voltage level detecting means detects the voltage level.

8. The circuit of claim 6, wherein the first transistor is a PMOS transistor, the second, third, fourth and fifth transistors are NMOS transistors, and the first, second, and control electrodes being source, drain and gate electrodes, respectively, and the first potential being a ground potential.

9. The circuit of claim 1, wherein in the signal output means comprises:
   a first and second transistors of a first conductivity type;
   third and fourth transistors of a second conductivity type;
   an inverter; and
   a second latch, wherein the delayed second signal from the voltage level detection control means is applied to a control electrode of the first transistor having a first electrode that receives a first potential, and is also applied through the inverter to a control electrode of the third transistor having a first electrode coupled to a second potential, the output signal from the voltage level detecting means is commonly applied to control electrodes of the second and fourth transistors that are coupled in series between the first transistor and the third transistor, and a coupling point between second electrodes of the second and fourth transistors can be coupled to an output terminal through the second latch.

10. The circuit of claim 9, wherein the first and second transistors are PMOS transistors, the third and fourth transistors are NMOS transistors, and the first, second, and control electrodes being source, drain and gate electrodes, respectively, and the first and second potentials being source and ground potentials, respectively.

11. The circuit of claim 1, wherein the voltage level detecting means transitions the voltage level detecting circuit to a stand-by mode after detecting the voltage level.

12. A voltage level detecting circuit, comprising:
   a voltage level detection controller that outputs a two-part control signal after logically operating first and second separate clock signals and delays the second clock signal for a predetermined time;
   a voltage level detector that initializes using a first part of the control signal and then detects a voltage level using a second part of the control signal; and a signal output circuit that latches the detected voltage level from the voltage level detector after the voltage level detector is initialized.

13. The circuit of claim 12, wherein the voltage level detector is initialized prior to each voltage level detection based on a delayed second clock signal.

14. The circuit of claim 12, wherein the voltage level detecting circuit changes to a power conserving mode based on the second part of the control signal after detecting the voltage level.

15. The circuit of claim 12, wherein in the voltage level detector comprises:

a first transistor of a first conductivity type;

second, third, fourth and fifth transistors of a second conductivity type; and a first latch, wherein the control signal from the voltage level detection control means is commonly applied to control electrodes of the first transistor and the second transistor, wherein the third, fourth and fifth transistors are coupled in series between a second electrode of the first transistor and a second electrode of the second transistor, wherein the third, fourth and fifth transistors have commonly coupled control electrodes and second electrodes, a coupling point between the second electrode of the second transistor and a first electrode of the fifth transistor couples to the signal output means through the first latch, a voltage to be detected is applied to a first electrode of the first transistor, and a first electrode of the second transistor is coupled to a first potential.

16. The circuit of claim 15, wherein the control signal turns off the first and second transistor after the voltage level detector detects the voltage level.

17. The circuit of claim 12, wherein the voltage level detection controller comprises:

a delay circuit that delays the second clock signal for the predetermined time to output the delayed second signal;

a first logic gate for logically operating an inverted second signal and the delayed second signal, wherein the first logic gate generates a pulse that initializes the voltage level detecting means; and a second logic gate for logically operating an output signal from the first logic gate and the first clock signal to output the control signal.

18. The circuit of claim 12, wherein in the signal output circuit comprises:

a first and second transistors of a first conductivity type;

third and fourth transistors of a second conductivity type;

an inverter; and a second latch, wherein the delayed second signal from the voltage level detection control means is applied to a control electrode of the first transistor having a first electrode that receives a first potential, and is also applied through the inverter to a control electrode of the third transistor having a first electrode coupled to a second potential, the output signal from the voltage level detecting means is commonly applied to control electrodes of the second and fourth transistors that are coupled in series between the first transistor and the third transistor, and a coupling point between second electrodes of the second and fourth transistors can be coupled to an output terminal through the second latch.

19. A voltage level detecting circuit, comprising:

voltage level detection control means for outputting a control signal after logically operating first and second signals and for delaying the second signal for a predetermined time;

voltage level detecting means for detecting a voltage level based on the control signal from the voltage level detection control means; and signal output means for receiving an output signal from the voltage level detecting means after the voltage level detecting means is initialized based on the delayed second signal in the voltage level detection control means, wherein the signal output means comprises;

a first and second transistors of a first conductivity type, third and fourth transistors of a second conductivity type, an inverter, and a second latch, wherein the delayed second signal from the voltage level detection control means is applied to a control electrode of the first transistor having a first electrode that receives a first potential, and is also applied through the inverter to a control electrode of the third transistor having a first electrode coupled to a second potential, the output signal from the voltage level detecting means is commonly applied to control electrodes of the second and fourth transistors that are coupled in series between the first transistor and the third transistor, and a coupling point between second electrodes of the second and fourth transistors can be coupled to an output terminal through the second latch.

20. A voltage level detecting circuit, comprising:

a voltage level detection controller that outputs a control signal after logically operating first and second signals and delays the second signal for a predetermined time;

a voltage level detector that detects a voltage level based on the control signal; and a signal output circuit that latches an output signal from the voltage level detector after the voltage level detector is initialized, wherein in the signal output circuit comprises;

a first and second transistors of a first conductivity type, third and fourth transistors of a second conductivity type, an inverter, and a second latch, wherein the delayed second signal from the voltage level detection control means is applied to a control electrode of the first transistor having a first electrode that receives a first potential, and is also applied through the inverter to a control electrode of the third transistor having a first electrode coupled to a second potential, the output signal from the voltage level detecting means is commonly applied to control electrodes of the second and fourth transistors that are coupled in series between the first transistor and the third transistor, and a coupling point between second electrodes of the second and fourth transistors can be coupled to an output terminal through the second latch.

* * * * *